US010665512B2

(12) United States Patent
Zhou et al.

(10) Patent No.: US 10,665,512 B2
(45) Date of Patent: May 26, 2020

(54) STRESS MODULATION OF NFET AND PFET FIN STRUCTURES

(71) Applicant: International Business Machines Corporation, Armonk, NY (US)

(72) Inventors: Huimei Zhou, Albany, NY (US); Kangguo Cheng, Schenectady, NY (US); Michael P. Belyansky, Halfmoon, NY (US); Oleg Gluschenkov, Tannersville, NY (US); Richard A. Conti, Altamont, NY (US); James Kelly, Schenectady, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/163,275

(22) Filed: Oct. 17, 2018

(65) Prior Publication Data
US 2020/0126867 A1 Apr. 23, 2020

(51) Int. Cl.
*H01L 21/8238* (2006.01)
*H01L 27/092* (2006.01)
(Continued)

(52) U.S. Cl.
CPC .... *H01L 21/823821* (2013.01); *H01L 21/765* (2013.01); *H01L 21/823878* (2013.01);
(Continued)

(58) Field of Classification Search
CPC ..... H01L 21/823807; H01L 21/823821; H01L 27/0924; H01L 29/66545; H01L 29/7843; H01L 21/823431; H01L 21/823437
(Continued)

(56) References Cited

U.S. PATENT DOCUMENTS 8,008,724 B2   8/2011   Doris et al.
8,766,364 B2   7/2014   Doornbos et al.
(Continued)

OTHER PUBLICATIONS

H. P. Kattelus et al., "Bias-induced stress transitions in sputtered TiN films," Journal of Vacuum Science & Technology A, vol. 4, No. 4, 1986, pp. 1850-1854.
(Continued)

*Primary Examiner* — Jonathan Han
(74) *Attorney, Agent, or Firm* — Vazken Alexanian; Otterstedt, Wallace & Kammer, LLP

(57) ABSTRACT

Compressive and tensile stress is induced, respectively, on semiconductor fins in the pFET and nFET regions of a monolithic semiconductor structure including FinFETs. A tensile stressor is formed from dielectric material and a second, compressive stressor is formed from metal. The stressors may be formed in fin cut regions of the monolithic semiconductor structure and are configured to provide stress in the direction of FinFET current flow. The dielectric material may be deposited on the monolithic semiconductor structure and later removed from the fin cut regions of the pFET region. Metal exhibiting compressive residual stress is then deposited in the fin cut regions from which the dielectric material was removed. Gate cut regions may also be filled with the dielectric stressor material to impart substantially uniaxial tensile stress perpendicular to the semiconductor fins and perpendicular to electrical current flow.

14 Claims, 2 Drawing Sheets

(51) Int. Cl.
    *H01L 21/84*       (2006.01)
    *H01L 21/765*     (2006.01)
    *H01L 23/60*       (2006.01)
    *H01L 27/12*       (2006.01)
    *H01L 29/78*       (2006.01)

(52) U.S. Cl.
    CPC ............ *H01L 21/845* (2013.01); *H01L 23/60* (2013.01); *H01L 27/0924* (2013.01); *H01L 27/1211* (2013.01); *H01L 29/7845* (2013.01); *H01L 29/7846* (2013.01)

(58) Field of Classification Search
    USPC .............................. 257/369, E27.06; 438/218
    See application file for complete search history.

(56) References Cited

U.S. PATENT DOCUMENTS

| | | | |
|---|---|---|---|
| 9,537,007 | B2 | 1/2017 | Yang et al. |
| 9,761,495 | B1 | 9/2017 | Xie et al. |
| 9,991,361 | B2 | 6/2018 | Dai et al. |
| 2016/0035727 | A1 | 2/2016 | Brunco |
| 2017/0040324 | A1* | 2/2017 | Yang ................... H01L 27/0886 |
| 2017/0200653 | A1* | 7/2017 | Loubet ............. H01L 29/41791 |
| 2018/0062352 | A1* | 3/2018 | Clifton ................ H01L 31/0352 |
| 2018/0108661 | A1 | 4/2018 | Guo et al. |

OTHER PUBLICATIONS

Y. G. Shen et al., "Residual stress, microstructure, and structure of tungsten thin films deposited by magnetron sputtering," Journal of Applied Physics, vol. 87, No. 1, 2000, pp. 177-187.

G. C. A. M. Janssen et al., "Tensile stress in hard metal films," Applied Physics Letters, vol. 83, No. 16, 2003, pp. 3287-3289.

Pei Zhao et al., "Influence of stress induced CT local layout effect (LLE) on 14nm FinFET," Symposium on VLSI Technology, 2017, pp. T228-T229.

\* cited by examiner

STRESS MODULATION OF NFET AND PFET FIN STRUCTURES

BACKGROUND

The present inventions relate generally to the electrical, electronic and computer arts and, more particularly, to nFET and pFET structures including stress-inducing features and the fabrication of such structures.

Fin-type field-effect transistors (FinFETs) have three-dimensional, non-planar configurations including fin-like structures extending above substrates. The substrates may include semiconductor on insulator (SOI) substrates or bulk semiconductor substrates. Semiconductor fins are formed in some FinFETs on substrates via known technology such as sidewall image transfer (SIT). FinFET structures including SOI substrates can be formed, in part, by selectively etching the crystalline silicon or other semiconductor layers down to the oxide or other insulating layers thereof following photolithography. Active fin heights, the channel fin region where the flow of electrical current is controlled by the gate, are set by SOI thickness when employing SOI substrates. In bulk FinFETs, active fin height is set by doping bottom portion of fins and the depth of gate wrap around. The gates of FinFETs can be formed using a "gate-first" process wherein a gate stack and spacers are formed prior to selective epitaxial growth wherein source and drain regions are enlarged. A "gate-last" process may alternatively be employed wherein a permanent gate stack is formed after forming source and drain regions. Gate-last procedures can involve forming a dummy gate, fabricating other elements of the transistor such as the source/drain regions, removing the dummy gate, and replacing the removed dummy gate with actual gate materials.

BRIEF SUMMARY

Techniques are provided for incorporating stressors on FinFET structures. Monolithic semiconductor structures including stressors and FinFETs are further provided.

In one aspect, an exemplary method of fabricating a monolithic semiconductor structure including tensile and compressive stressors includes obtaining a monolithic structure including an nFET region and a pFET region. Each of the nFET and pFET regions includes a plurality of semiconductor fins. Each of the semiconductor fins includes a channel region having a top channel boundary and a bottom channel boundary. A plurality of gate structures extends across the plurality of semiconductor fins. Source/drain regions are on opposing sides of each of the plurality of gate structures and are operatively associated with the channel regions. A fin cut region extends across the plurality of semiconductor fins in each of the nFET and pFET regions. Opposing semiconductor fin end portions are separated by the fin cut region. A dielectric tensile stressor layer is formed on the monolithic structure. The dielectric tensile stressor layer includes first portions extending into the fin cut regions and second portions extending over the source/drain regions and between the gate structures of the nFET and pFET regions. One of the first portions of the dielectric tensile stressor layer is removed from the fin cut region within the pFET region. The first portion of the dielectric tensile stressor layer within the fin cut region of the nFET region and the second portions of the dielectric tensile stressor layer remain essentially intact. A metal compressive stressor layer is formed within the fin cut region in the pFET region from which the first portion of the dielectric tensile stressor layer was removed. The first portion of the dielectric tensile stressor layer induces substantially uniaxial tensile stress in the direction of electrical current flow on the semiconductor fins in the nFET region. The metal compressive stressor layer induces substantially uniaxial compressive stress in the direction of electrical current flow on the semiconductor fins in the pFET region.

In a further aspect, an exemplary monolithic structure includes an nFET region and a pFET region. Each of the nFET and pFET regions include a plurality of semiconductor fins, the semiconductor fins including channel regions, each of the channel regions having top channel boundary and a bottom channel boundary. Each of the nFET and pFET regions further includes a plurality of gate structures extending across the plurality of semiconductor fins, source/drain regions on opposing sides of each of the plurality of gate structures and operatively associated with the channel regions, a fin cut region extending across the plurality of semiconductor fins, and a pair of opposing semiconductor fin end portions separated by the fin cut region. A dielectric tensile stressor layer on the monolithic structure includes a first portion extending into the fin cut region of the nFET region. A metal compressive stressor layer is within the fin cut region in the pFET region. The first portion of the dielectric tensile stressor layer induces substantially uniaxial tensile stress in the direction of electrical current flow on the semiconductor fins in the nFET region and the metal compressive stressor layer induces substantially uniaxial compressive stress in the direction of electrical current flow on the semiconductor fins in the pFET region.

In a still further aspect, an exemplary method of fabricating a monolithic semiconductor structure including tensile and compressive stressors includes obtaining a monolithic structure including an nFET region and a pFET region. Each of the nFET and pFET regions includes a plurality of semiconductor fins having channel regions, each of the channel regions having a top channel boundary and a bottom channel boundary. Each of the nFET and pFET regions further includes a plurality of gate structures extending across the plurality of semiconductor fins, source/drain regions on opposing sides of each of the plurality of gate structures and operatively associated with the channel regions, a fin cut region extending across the plurality of semiconductor fins, and a pair of opposing semiconductor fin end portions separated by the fin cut region. A dielectric tensile stressor layer is formed on the monolithic structure and includes first portions extending into the fin cut regions and second portions extending over the source/drain regions and between the gate structures of the nFET and pFET regions. One of the first portions of the dielectric tensile stressor layer is removed from the fin cut region within the pFET region, the first portion of the dielectric tensile stressor layer within the fin cut region of the nFET region and the second portions of the dielectric tensile stressor layer remaining essentially intact. A metal compressive stressor layer is formed within the fin cut region in the pFET region from which the one the first portions of the dielectric tensile stressor layer was removed. The first portion of the dielectric tensile stressor layer induces substantially uniaxial tensile stress in the direction of electrical current flow on the semiconductor fins in the nFET region and the metal compressive stressor layer induces substantially uniaxial compressive stress in the direction of electrical current flow on the semiconductor fins in the pFET region.

Techniques as disclosed herein can provide substantial beneficial technical effects. By way of example only and without limitation, one or more embodiments may provide one or more of the following advantages:

Improved performance of nFET and pFET devices using tensile and compressive stressors;

Device performance modification through fin cut/gate cut layout design;

Simplification of fabrication process of structures including nFET and pFET devices.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
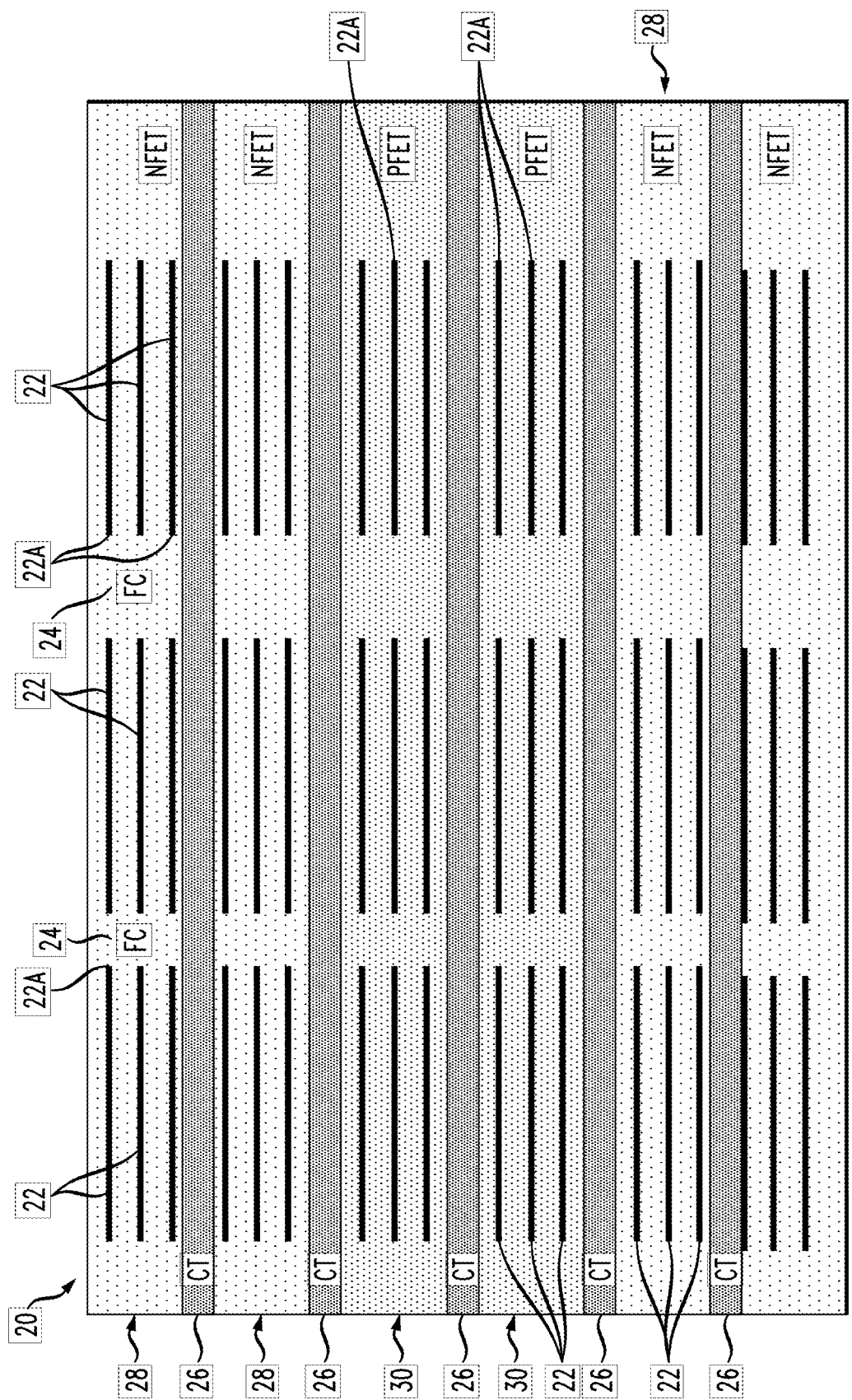
FIG. 1 is a schematic top plan view of an exemplary layout of nFET and pFET regions.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a FinFET structure wherein stressors are formed to provide tensile and compressive forces on semiconductor fins to respectively enhance performance of nFET and pFET devices.

The FinFET structure includes semiconductor fins formed in a substrate. The semiconductor fins are typically etched in semiconducting material having (100) crystallographic top surface and are oriented along <110> directions. In this arrangement, the fin top surface is the (100) crystallographic plane and the fin side surfaces are (110) crystallographic planes. The semiconducting material can include silicon or silicon germanium. The thickness of semiconducting fins can be from 5 nm to 15 nm, although lesser and greater thicknesses can also be employed. The height of semiconducting fins can be from 25 nm to 150 nm, although lesser and greater height can also be employed. The minimal fin spatial period or the fin pitch can be from 25 nm to 60 nm, although lesser and greater fin pitch can also be employed. The semiconductor fins can be isolated from each other and/or from the substrate using isolation dielectric plugs formed in a lower fin portion in between fins and/or underneath the fins. The dielectric isolation plugs can include a dielectric material such as silicon oxide, silicon nitride, or silicon oxynitride. The fin height above the top surface of isolation dielectric plugs can be from 25 nm to 75 nm, although lesser and greater thicknesses can also be employed.

In some replacement metal gate (RMG) processes, disposable gate level layers are deposited on a semiconductor fin structure as blanket layers, i.e., as unpatterned contiguous layers. The disposable gate level layers can include, for example, a vertical stack including a disposable gate dielectric, gate material layer, and a disposable gate cap dielectric layer. The disposable gate material layer includes a material that can be removed selective to the gate dielectric material, the isolation plug dielectric material, and a planarization dielectric layer to be subsequently formed. For example, the disposable gate material layer can include a semiconductor material such as a polycrystalline (PC) semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to the gate dielectric material, the isolation plug dielectric material, and a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form the disposable gate structures. The disposable gate stacks may or may not be comprised of the same materials in the nFET and pFET regions. The gate cap portions are remaining portions of the disposable gate cap dielectric layer and the disposable gate material portions are remaining portions of the disposable gate material layer. Gate spacers can be formed on sidewalls of each of the disposable gate structures, for example, by deposition of a conformal dielectric material layer and an anisotropic etch.

Source/drain regions are formed after the disposable gate structures and gate spacers have been completed. For example, selected n-type dopants can be introduced into portions of the nFET region that are not covered by disposable gate structures and gate spacers to form source/drain regions. Similarly, other selected p-type dopants can be introduced into portions of the pFET region that are not covered by disposable gate structures and gate structures. The methods of selectively introducing dopants into source/drain regions may include selective epitaxial growth with in-situ doping, partial fin recess, and ion implantation. The entire substrate is then subjected to a rapid thermal anneal to induce a precise diffusion of source/drain dopants underneath the gate spacer forming an overlap between the source/drain regions and the disposable gate structures. The depth to which source/drain regions are doped is roughly equal or deeper than the active fin height to provide an unimpeded current flow to and from the transistor channel.

A planarization dielectric layer is deposited over the semiconductor substrate, the source/drain regions, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are ordinarily formed in the gate cavities. Replacement gate structures are formed by replacement of the disposable structures and overlie channel regions of field-effect transistors. A gate dielectric layer and a gate electrode are formed within each of the gate cavities. The disposable gate dielectric can be stripped first and a suitable semiconductor surface treatment can be performed completing semiconductor surface preparation steps for forming a permanent gate dielectric layer. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition. A gate electrode is formed over the gate dielectric layer. The gate electrode can be different for different transistors. The forming gate electrode may include depositing conductive material such metals, metal nitrides, metal carbides, patterning them using known photolithography techniques, removing portions of gate electrode from pre-selected areas, and depositing a different set of conductive materials. The sequence of depositing, patterning, and removing portions of gate electrode can be repeated to accommodate transistors of different type such as nFET and pFET and with different target threshold voltages. Methods of forming gate dielectric and gate electrode may include a set of anneals to set the threshold voltages of transistors, improve transistor reliability, and to activate or re-activate source/drain dopants. Once the gate cavities are completely filled with a conductive material, a planarization step is conducted to remove excess conductive material outside the gate cavities. Dielectric gate caps can be formed onto conductive gate structures to fully encapsulate the gate and to allow for forming self-aligned contacts to source/drain regions.

The electrical contacts are then formed to source/drain regions and the gate structures. Trenches are patterned and etched in the dielectric layer using suitable RIE processes to make an access to source/drain regions and to the gate. The trenches are filled with conductive material including metal liners and metal fill. A silicide interfacial layer can be formed between conductive contact structures and doped semiconducting source/drain regions to reduce any impact of the contact resistance to transistor performance. A network of metallic interconnects is then employed to wire formed electrical contacts to FinFETs into useful circuits.

The performance characteristics of FinFETs and related electrical circuits can be affected by mechanical stresses exerted on the semiconductor fins. The exerted mechanical stress can be completely characterized by the stress tensor that has six (6) independent components. The FinFET performance can be improved or degraded depending on stress tensor components and semiconductor crystal orientation in the fin. The semiconductor fins are typically etched on (100) substrates and oriented along <110> crystallographic directions making the electrical current flow along (110) planes in <110> direction, as alluded above. A single compressive stress tensor component along the electrical current flow, often referred to as the compressive uniaxial channel stress in the direction of current flow, greatly improves performance of pFinFETs and slightly degrades performance of nFinFETs. A single tensile stress tensor component along the electrical current flow, often referred to as the tensile uniaxial channel stress in the direction of current flow, improves performance of nFinFETs and degrades the performance of pFinFETs. However, a tensile stress tensor component perpendicular to the electrical current flow and orthogonal to (110) fin surfaces improves nFinFET performance while not affecting pFinFET performance and a compressive stress tensor component perpendicular to the electrical current flow and orthogonal to (110) fin surfaces degrades both pFinFET and pFinFET performances. Different stressor configurations can be utilized to induce either uniaxial or mixed tensile or compressive stresses in semiconductor structures in multiple directions. For example, a shrinking flowable oxide can function as a tensile stressor by inducing tensile stress in surrounding structures.

FIG. 1 depicts an exemplary layout 20 similar to that which may be employed for a ring oscillator. A ring oscillator is obtained by placing an odd number of open-loop inverting amplifiers in a feedback loop. A CMOS inverter is a circuit that is built from a pair of nMOS and pMOS transistors operating as complementary switches. In the exemplary layout 20, n-channel and p-channel FinFETs are to be employed in fabricating a ring oscillator or other circuit. As shown in FIG. 1, parallel semiconductor fins 22 are provided in nFET and pFET regions 28, 30. The nFET and pFET fin regions will be electrically isolated. The layout 20 includes fin cut (FC) areas 24 running parallel to each other and perpendicularly to the fins 22. The FC areas 24 separate groups of parallel fins within each of the regions 28, 30. The fins include end portions 22A adjoining the FC areas. Pairs of opposing fin end portions 22A are separated by the FC areas 24.

The layout 20 further shows CT or gate cut regions 26 that extend parallel to the semiconductor fins 22 and to each other. The CT regions 26 comprise trenches that cut through dummy gates (not shown in FIG. 1). Such trenches are eventually filled with electrically insulating material such as an ILD (interlevel dielectric) oxide. As described below, a method is provided for incorporating different stressor materials in areas extending perpendicularly to the fins such as the FC areas 24 of the nFET and pFET regions, respectively.

Figure 2:
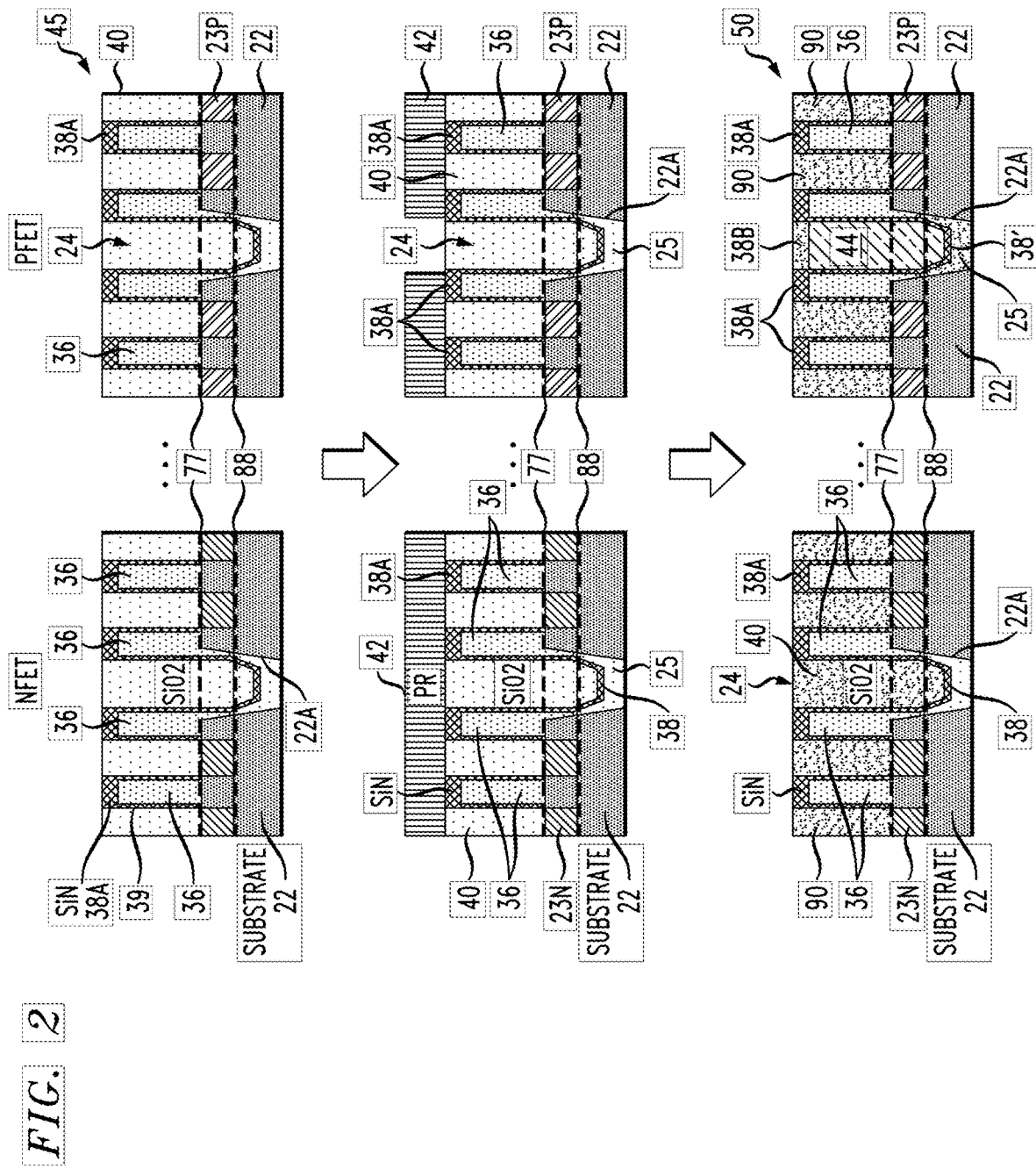
FIG. 2 is a flow diagram including schematic, cross-sectional views showing the formation of stressors exerting tensile and compressive stress onto nFET and pFET regions of a semiconductor structure.

FIG. 2 provides cross-sectional views of a process flow to provide different stresses on the fins in the nFET and pFET regions of a monolithic structure. A substrate including parallel semiconductor fins is employed in the fabrication of nFET and pFET devices in the nFET and pFET regions, respectively. Fabrication of FinFETs is described above. The nFETs have n-type source/drain regions 23N while the pFETs have p-type source/drain regions 23P.

Referring again to FIG. 2, the monolithic structure includes semiconductor fins 22 formed either from a bulk semiconductor substrate or a crystalline semiconductor layer, which can be referred to as an SOI layer, of a semiconductor-on-insulator substrate. Fin pitch is 25-50 nm in some embodiments. The substrate layer is essentially undoped in one or more embodiments and the semiconductor fins 22 are substantially monocrystalline in some embodiments. The fins can comprise pure silicon or silicon germanium. nFET fins are typically made of pure silicon while pFET fins can be made from either pure silicon or silicon germanium with germanium content of from about 5% to about 30%. SiGe fins can be strained when formed on a silicon substrate.

In one embodiment, biaxially compressively strained SiGe islands are epitaxially grown in pFET active region 30 and then Si and SiGe fins are simultaneously formed. Biaxial stress means that there are two components of stress tensor in the island plane of nearly equal magnitude and sign. When SiGe fins are etched from the strained SiGe island, they lose most of the stress component perpendicular to the fin but retain most of the compressive stress along the fin. The heights of the fins 22 may be in the range of 10 nm to 150 nm. Methods of forming semiconductor fins 22 using photolithography or sidewall image transfer (SIT) are familiar to those of skill in the art. SIT facilitates the fabrication of fins that are smaller in spacing than photolithographic techniques permit. The SIT process forms features (such as fins) with a pitch equal to half or quarter of the smallest pitch obtainable with lithography. For example, with the state-of-the-art UV sources at 193 nm wavelength the smallest pitch that can be formed with conventional lithography is about 80 nm; the SIT process can generate fins with a pitch of about 40 nm. Fins 22 having widths of eight nanometers (8 nm) or less are provided in some embodiments. It will be appreciated that the fins 22 may or may not have sidewalls that are entirely vertical. The bottoms of the fins may in fact be larger in width than the top portions thereof. For example, if a substrate in an exemplary embodiment is a (100) substrate, the side wall surfaces of the semiconductor fins described as (110) surfaces are at least close to being (110) surfaces but may or may not be exactly (110) surfaces.

It will be appreciated that the SIT patterning technique forms long fin loops rather than parallel fins. In order to form parallel fins the loop ends are cut. This is accomplished with a fin cut lithographic shape known as fin cut (FC) shape. In addition to erasing fin end loops, the FC lithographic shape can cut fins into shorter sections. Accordingly, the FC regions 24 are obtained by cutting through the fins 22. Sets of fins having end portions 22A adjoining the FC regions 24 are accordingly obtained. If the fins were strained such as in the case of SiGe fins formed on a Si substrate, the fin cut will relax the strain near fin ends negatively affecting transistor performance.

Any suitable process capable of removing fin material can be used to form the FC regions 24. Anisotropic reactive ion etching is a directional etch employed in one or more exemplary embodiments for the complete and selective removal of selected portions of the semiconductor fins 22 to form the FC regions 24. Fin cut regions 24 may have a deeper recess of semiconducting material than the adjacent fins. There could be multiple fin cut patterning and etching processes conducted at different steps of the process flow. This can result in multiple fin cut regions recessed to different depths. It will be appreciated that the fin cut regions can serve as isolation regions between different fin types such as fins formed for nFET and pFET transistors. Electrically insulating material such as silicon dioxide and/or silicon nitride is deposited within the trenches formed by the removal of fin material and comprise isolation between individual fins (not shown) and shallow trench isolation (STI) regions between different fin types. The insulating material may have different layers. It may include a fin spacer material such as silicon nitride and the filler material such as spin-on or flowable silicon oxide. The filler material is then recessed to a desired depth revealing a top portion of fins.

The revealed fin serves as the basis for forming transistor channel and is often referred to as an "active" portion of fins. The bottom or inactive portion of the fin is doped to a higher level than the active portion with the dopant opposite to transistor polarity. For instance, fins for nFETs will be doped with p-type dopant such as boron to $1\text{-}50\times10^{16}$ cm$^{-3}$ in the active portion and to $1\text{-}5\times10^{18}$ cm$^{-3}$ in the inactive portion and, conversely, fins for pFETs will be doped with n-type dopant such as phosphorus or arsenic to $1\text{-}50\times10^{16}$ cm$^{-3}$ in the active portion and to $1\text{-}5\times10^{18}$ cm$^{-3}$ in the inactive portion. The higher level of dopant prevents gate-induced charge inversion in the inactive fin portion and provides junction isolation between source and drain regions 23N and 23P to be formed at later steps. Alternatively, the lightly doped active portion of the fin can be decoupled and isolated from the substrate with a buried dielectric layer of an SOI substrate. The retrograde doping can be accomplished by a number of suitable techniques such as high energy ion implantation, growing a stack of epitaxial layers with desired retrograde distribution of suitable dopant profiles prior to forming fins, and doping from within the isolation regions. The fin sidewalls in its active portion are made close to vertical or to a zero degree slope. This ensures that the fin sidewall surface is close to (110) crystallographic planes yielding desired stress response to external stressors. Accordingly, in some embodiments, the sidewall slope in the active fin portion is preferably less than +/−10 degrees and more preferably less than +/−3 degrees from the vertical.

Polysilicon and gate dielectric layers may be deposited or otherwise formed on the finned substrate and patterned to form dummy gates (not shown) in accordance with standard polysilicon gate CMOS process flows. Similar to fins, the dummy gates can be patterned using photolithography or sidewall image transfer (SIT). It will be appreciated that the SIT patterning technique forms long gate loops rather than parallel gate. In order to form parallel gates the loop ends are cut. This is accomplished with a gate cut lithographic shape known as CT shape. In addition to erasing SIT-related gate end loops, the lithographic shape can cut gates into shorter sections. The layout 20 of FIG. 1 shows CT or gate cut regions 26 that extend parallel to the semiconductor fins 22 and perpendicular to gates (not shown in FIG. 1). The CT regions 26 comprise trenches that cut through dummy gates. The dummy gates extend across the parallel semiconductor fins 22 in the nFET and pFET regions of the substrate and have substantially the same dimensions in one or more embodiments. The dummy gate wraps around the active fin portion and runs over the dielectric isolation areas formed in between individual fins. The transistor channel boundaries are defined by a combination of dummy gate fin wrap around and the onset of fin doping increase in the fin bottom section. The top transistor channel boundary is shown schematically by the dotted line 77 and the bottom transistor channel boundary is shown schematically by the dotted line 88. In one embodiment, the channel height or the distance between dotted lines 77 and 88 is from about 10 nm to about 60 nm. Any gate pitch suitable for the intended application of the completed product may be chosen. Gate sidewall structures or spacers 39 are formed on the dummy gates. Spacer material such as silicon nitride ($Si_3N_4$) layer can be deposited via CVD, PECVD, sputtering, or other suitable technique. The spacers can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The gate spacer material 39 can be the same as the fin spacer material 38. The dummy gates and associated spacers 39 protect the underlying portions of the semiconductor fins 22 that later function as channel regions of FinFET devices. The spacers 39 may alternatively be formed from other materials, for example siliconborocarbonitride (SiBCN), siliconoxycarbonitride (SiOCN), or siliconoxycarbide (SiOC).

Expanded source/drain regions 23N, 23P are grown epitaxially on the exposed sidewall portions of the semiconductor fins 22. Doped silicon or silicon germanium grown epitaxially on the sidewalls (110 surfaces) of silicon fins increases the volumes of the source/drain regions, provides doping, and acts as stressors in some embodiments. Alternatively, the exposed fins can be recessed prior to the epitaxial growth. The recess sets the depth of S/D regions and is roughly the same as the active fin height. Recessing fins exposes (100) semiconductor plane at the bottom and speeds up epitaxial growth process. If the fins were strained such as in the case of SiGe fins formed on a Si substrate, the fin recess will relax the strain near fin ends negatively affecting transistor performance. Either p-channel devices (pFETs) or n-channel devices (nFETs) can be fabricated by matching the source/drain dopant or conductivity type to transistor channel type in inversion, as known in the art.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. The channel doping is typically opposite to the channel type that is the n-channel of nFET is lightly doped with p-type dopant whereas the p-channel type of pFET is lightly doped with n-type dopant. In embodiments where nFinFET devices are to be formed, in-situ n-doped silicon may be used to form the epitaxial source/drain regions 23N. In-situ doping of the source/drain regions can be conducted using conventional precursor materials and techniques. Source/drain epitaxy to form p-doped source/drain regions 23P may include the introduction of boron precursor gas such as diborane. The p-doped source/drain regions 23P may consist essentially of boron-doped silicon germanium in one or more exemplary embodiments. In one exemplary embodiment where the doped source/drain semiconductor material is silicon germanium (SiGe) containing about fifty-five percent (55%) germanium, the dopant is boron in a concentration in the range of $2-9 \times 10^{20}$ $cm^{-3}$ and the resulting pFinFET structure. One benefit of forming SiGe source drain is inducing nearly uniaxial compressive stress in the direction of current flow for the pFinFET. It also allows for re-gaining stress benefits for pFinFETs in the case of strained SiGe fins that were partially relaxed at their ends by fin cutting and/or recessing steps. Other benefits of forming SiGe source/drain regions include improved/reduced source/drain series resistance and improved/reduced contact resistance. In other embodiments, the source/drain semiconductor material is n-doped silicon, the dopant is phosphorus in a concentration in the range of $1-5 \times 10^{21}$ $cm^{-3}$ or 2-10 atomic % of phosphorus in Si and the resulting FinFET structure is n-type. One benefit of forming Si:P source/drain regions with a relatively high phosphorus concentration is inducing nearly uniaxial tensile stress in the direction of current flow for the nFinFET.

Exemplary epitaxial growth processes that are suitable for use in forming silicon and/or silicon germanium epitaxy include chemical vapor deposition (CVD), "pulsed" or "atomic layer" chemical vapor deposition/epitaxy, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 450° C. to 900° C. Fin sidewall surfaces are (110) surfaces in one or more embodiments such that epitaxial growth thereon produces in diamond-shaped structures due to the fact that the growth rate on (111) planes is considerably less than on (110) planes. Self-limiting diamond-shaped structures can accordingly be formed. It will be appreciated that doped source/drain regions can be formed using other known methods including but not limited to implantation and diffusion doping techniques. The entire substrate is then subjected to a rapid thermal anneal at about 900-1000° C. to induce a precise diffusion of source/drain dopants underneath the gate spacer forming an overlap between the source/drain regions and the disposable gate structures. The depth to which source/drain regions are doped is roughly equal or deeper than the active fin height to provide an unimpeded current flow to and from the transistor channel.

Once the source/drain regions 23N, 23P have been formed and possibly other processing steps are completed, an electrically insulating (ILD) layer 40 as shown in FIG. 2 is deposited on the structure. The ILD layer fills the areas between the dummy gates and the FC regions 24 in both the nFET and pFET regions of the structure. The ILD layer 40, for example silicon dioxide, can be deposited and cured using techniques selected to form a tensile stressor material. In an exemplary embodiment, the ILD layer 40 will ultimately remain in the nFET regions of the substrate and will be removed from the FC regions within the pFET regions. The deposition and cure or anneal techniques used to form the ILD layer of the exemplary embodiment will accordingly be conducive to forming a tensile stressor (inducing tensile stress in surrounding material) from the ILD material. The ILD layer 40 is cured or annealed and then planarized using chemical mechanical planarization (CMP) techniques. An optional rigid dielectric cap such as silicon nitride (not shown for clarity) can be deposited on top of the planarized oxide-based ILD material for encapsulation and preservation purposes. The cap will serve as an etch or planarization stopping layer in downstream processing steps. ILD annealing or curing steps often induce a volume change or shrinking of ILD material imparting tensile stress in surrounding materials. The annealing or curing step can be conducted immediately after deposition or after planarization and encapsulation steps, or a combination of partial oxidation curing after deposition and stress inducing curing/annealing after planarization and encapsulation.

As discussed, the volumes of space adjoining the ends 22A of the fins 22 are filled with a tensile stressor that induces a tensile stress upon the semiconductor fins. The distance between fin ends 22A (i.e. the widths of the FC regions) can be about one gate length to about 3 gate pitches or from about ten nanometers to about two hundred nm nanometers (10 nm-200 nm), although from about 15 nm to about 40 nm being more typical, it being appreciated that the fin ends may not be entirely vertical. Embodiments of the present invention can use an oxide filling material that includes, at first, a silazane-chain (—$Si_2NH$—) containing material deposited, for example, using flowable chemical vapor deposition. Alternatively, an oxide filling material includes, at first, a silazane-chain containing material deposited, for example, using spin-on deposition. Oxidation curing of this silazane-chain containing material can be accomplished by ozone treatments, steam anneals, high-temperature anneals, exposure to UV radiation, or a combination thereof. Oxidation curing processes convert this silazane-chain containing material into a siloxane chain (—Si—O—) network, the backbone of silicon oxide dielectric, by reducing the content of hydrogen and nitrogen constituents that allow for material flowability and increasing amount of oxygen that allows for forming good quality silicon oxide dielectric. Importantly, curing of this silazane chain containing material causes it to shrink and induce tensile stress on surrounding structures. Annealing of the ILD layer 40 may be conducted from 350° C.~650° C. to cause the ILD material to shrink and induce tensile stress on the surrounding structures, including the semiconductor fins 22. The silazane-chain containing material shrinks by about 5-15% percent by volume when it has a free surface. In a confined space such as within FC trenches, the volume shrinking is partially offset by building up high tensile stress (>500 MPa) in surrounding material. In some embodiments, the level of tensile stress induced in surrounding materials by shrinking ILD film can be 1-4 GPa. Making FC trenches deeper than the bottom transistor channel boundary 88 helps with imparting a more uniform tensile stress along the active fin height. Specifically, making FC trenches deeper than the bottom transistor channel boundary 88 by about one third to one half of transistor channel height or by about 10-30 nm ensures imparting a high uniform uniaxial tensile stress along the electrical current flow. This nearly uniaxial tensile stress improves performance of nFinFETs and degrades performance of pFinFETs. This beneficial nFET effect is in addition to any stress effect induced by the nFET source/drain structure. In addition to the FC regions 24 in both the nFET and pFET regions of the structure, the ILD layer 40 also fills the regions between dummy gates and over the source/drain regions 23N, 23P at this stage of the process. However, most of this ILD material in between dummy gates will be removed at the later steps during steps of forming source/drain contacts and, hence, would not impart much stress on surrounding final transistor structures. Furthermore, the ILD layer 40 also fills the gate cut CT trenches 26 in both the nFET and pFET regions of the structure, imparting nearly uniaxial tensile stress perpendicular to semiconductor fins 22 and perpendicular to FinFET electrical current flow. This nearly uniaxial tensile stress perpendicular to the current flow improves performance of nFinFETs while leaving pFinFET performance the same.

Gate stacks 36 including gate dielectric material and electrically conductive material replace the dummy gates for the nFET and pFET devices to be fabricated. The gate dielectric layer adjoins the sidewall spacers 38 and the channel regions of the fins 22 that extend between the source and drain regions. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by any suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Electrically conductive gate material is deposited in the regions formerly containing the dummy gates. The deposited metal gate material forms the metal gates 36 of the nFET and pFET devices, as shown in FIG. 2. Non-limiting examples of suitable electrically conductive metals for forming the metal gate include aluminum (Al), tungsten (W), titanium (Ti), tantalum (Ta) cobalt (Co), metal nitrides such as TiN, TaN and AlN, metal carbides such as TiC and TaC, or any combination thereof. The gate metal may be deposited using processes such as CVD, PECVD, PVD, plating, thermal or e-beam evaporation, or sputtering. The metal gates may further include a work function metal (WFM) layer. The gate metal deposited in the nFET region may or may not be the same as the metal deposited in the pFET region. A planarization process, for example, chemical mechanical planarization (CMP), is performed to polish the top surface of the deposited gate metal material. The structure 45 schematically illustrated at the top of FIG. 2 is obtained following the gate replacement process.

As the ILD material is to remain in the nFET regions and certain pFET regions of the structure where tensile stress is either desired or has no effect onto transistor performance, a photoresist layer 42 is deposited on the structure and patterned. As shown in the middle set of figures in FIG. 2, the patterned photoresist layer protects the ILD material within nFET regions of the substrate and over most of pFET regions exposing pFET FC regions and portions of pFET CT regions that intersect with FC regions. The size of patterned resist window over pFET FC regions does not need to match exactly the shape of FC cut around pFET fins, however, overlapping this window and FC shapes surrounding pFET fins is desirable. Nitride caps 38A formed over the adjacent gate stacks protect the metal gates 36 if the patterned resist access window is slightly larger than the original FC shape. The structure is subjected to a selective etch to cause the removal of the ILD material left unprotected by the patterned photoresist layer. An oxide filler layer can, for example, be selectively and directionally etched using $CHF_3$/Ar plasma reactive ion etch. The spacer material 38/39 can serve as an etch stopping layer for the oxide-based ILD etch. The ILD material accordingly is removed from the FC regions in the pFET regions and remains elsewhere. In embodiments wherein the dielectric stressor material is deposited on uncut fins and fins are isolated laterally via a junction isolation or, in other words, the explicit FC shape surrounding pFET fins does not exist, the patterned resist window is placed at the ends of active pFET fins and has dimensions of a typical FC shape, as alluded above. The unwanted ILD material is removed in the same manner described above, leaving bands of ILD material extending across a plurality of parallel fins 22. The bands of ILD material on the uncut fins (or uncut regions of the fins) are removed only from near the ends of pFET active fins and remain elsewhere.

The FC regions 24 in the pFET regions are filled with stressor material for applying nearly uniaxial compressive stress to the semiconductor fins 22 in the pFET regions in the direction of pFET current flow. The stressor material enhances the performance of the p-type FinFETs that are formed in the pFET regions. This beneficial effect is in addition to any stress effect induced by the pFET source/drain structure and/or pseudomorphically strained SiGe fins. It is hard to form a temperature-stable (>500° C.) highly compressive (more than 1 GPa in absolute value) dielectric films. Further, such films may have a high dielectric constant (e.g. SiN) leading to electrical cross-talk or coupling between adjacent fins. Physical vapor or sputter film deposition processes under low ambient gas pressures and a high degree of energetic particle bombardment (substrate bias) can lead to a high degree of compressive film stress in metal stressors including, for example, titanium nitride (TiN) and/or tungsten (W). Titanium nitride compressive residual stress can be as high as 10 GPa in absolute value but 4-6 GPa range is more typical. Tungsten films also exhibit a high compressive residual stress of 4-6 GPa in absolute value. This is well above typical compressive stresses observed in SiN:H dielectric films that range from 1.5 GPa to 3 GPa in absolute value. This is also well above typical compressive stresses observed in fully strained SiGe source/drain stressors or strained SiGe fins that range from 1 GPa to 3 GPa. These highly compressive conductive films are also temperature stable. Excess metal is removed using CMP. The metal plug 44 is optionally recessed and capped with a dielectric cap 38B. The thickness of cap 38B is approximately the same as that of the gate cap 38A. The dielectric cap material 38B can be the same or different from the gate cap material 38A. The excess dielectric cap material can be removed through an etch back process or by a touchup CMP. As shown in the bottom pair of figures in FIG. 2, the resulting structure 50 includes nFET regions and pFET regions including portions of the ILD layer 40 and pFET regions including portions of the metal layer 44 filling the FC regions 24 therein. The liner 38' and cap 38B isolates metal layer 44 from adjacent structures. This liner 38' above the dielectric layer 25 can be the same as the gate or fin spacer 39/38 but can be different. The liner material in the exposed FC trenches/cavities can be reformed using common deposition techniques. The liner 38' and cap 38B can comprise of silicon nitride (SiN), siliconborocarbonitride (SiBCN), siliconoxycarbonitride (SiOCN), or siliconoxycarbide (SiOC). The metallic plug 44 can be left isolated or electrically floated or can be connected to other conductive structures through a side contact. As discussed above, fabrication processes are employed in the exemplary embodiment such that the ILD layer is operable as a tensile uniaxial stressor in the nFET regions both along and perpendicular to nFET electrical current flow and the metal layer 44 is operable as a compressive uniaxial stressor in the pFET regions along pFET electrical current flow, thereby enhancing performance of the FinFETs formed in both nFET and pFET regions.

The metal layer or plug 44 can also help reducing crosstalk between adjacent fins if it is kept at a constant electrical potential such as ground (zero volts) or supply voltage (drain voltage) Vdd, or any constant voltage in between. If the metal layer 44 is held at a constant or nearly constant voltage, it functions as a Faraday shield reducing cross-talk between adjacent electrically active structures. The majority of pFETs in digital circuits operate as pull-up pFETs such that one of pFET source/drain terminals is tied to supply voltage Vdd. In this case, it may be beneficial to tie the metal layer 44 to a supply voltage line that is readily available nearby. This is accomplished by making a direct electrical contact to the metal layer 44 and connecting it to the selected constant voltage line such as supply voltage line Vdd. Alternatively, the metal layer 44 can be left isolated or electrically floating. This can have an effect of reducing total gate capacitance for adjacent gates. Both strategies can be implemented in one monolithic integrated circuit depending on pFET circuit and adjacent gate functions.

After completing forming the metallic stressor layer 44, electrical contacts are formed to sourced/drain regions, the gate structures, and possibly the metal layer 44. A sequence of photolithographic steps is typically used to define the desired contact shapes. Contact trenches are patterned using the defined contact shapes and etched in the dielectric layer using suitable RIE processes to make an access to source/drain regions 23N, 23P, to the metal gates 36, and possibly to the metal layer 44. The trenches are filled with conductive material 90 including metal liners and metal fill. The excess metal is removed by CMP and/or suitable wet or dry etching. All contacts trenches can be formed and filled simultaneously or they can be formed sequentially such as, for instance, forming contact trenches to source/drain regions 23N, 23P first and then forming contacts to metal gates 36 and possibly to the metal stressor layer 44. A silicide interfacial layer can be formed between conductive contact structures and doped semiconducting source/drain regions 23N, 23P to reduce any impact of the contact resistance to transistor performance. A network of metallic interconnects (not shown) is then employed to wire formed electrical contacts to FinFETs and possibly metal layer 44 into useful circuits.

In some embodiments, the steps of forming compressive metallic stressor 44 can be conducted concurrently with forming electrical contacts to source/drain structures 23P and possibly to both 23N and 23P. However, the presence of highly compressive metallic layer 44 in nFET source/drain regions 23N may lead to nFET performance degrade. Forming contacts separately to nFET source/drain regions 23N and pFET source/drain regions 23P complicates forming shared contacts between them. Furthermore, the contact metal fill 90 is carefully chosen to reduce both the contact resistance at metal-semiconductor interface and the contact plug series resistance, whereas the metal layer 44 is carefully chosen to impart a high compressive stress. Accordingly, forming metallic layer 44 independent of forming contacts to source/drain regions 23N, 23P is preferred.

In some embodiments, metal stressor material is formed on uncut semiconductor fins or uncut regions of the semiconductor fins and placed at the ends of active pFET fins and isolated from the fins with a dielectric liner. Bands of metal stressor material extend across a plurality of uncut fins and are configured to exert compressive stress on the fins in the pFET regions in some exemplary embodiments, thereby enhancing performance of the pFET devices within such regions.

FIG. 2, as discussed above, depicts exemplary processing steps/stages in the fabrication of an exemplary structure 50 including tensile dielectric stressors in nFET and pFET regions and compressive metallic stressor 44 in pFET FC regions. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having nFETs and pFETs formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a monolithic semiconductor structure including tensile and compressive stressors, comprising:
   obtaining a monolithic structure including an nFET region and a pFET region, each of the nFET and pFET regions comprising:
      a plurality of semiconductor fins, the semiconductor fins including channel regions, each of the channel regions having a top channel boundary and a bottom channel boundary,
      a plurality of gate structures extending across the plurality of semiconductor fins,
      source/drain regions on opposing sides of each of the plurality of gate structures and operatively associated with the channel regions,
      a fin cut region extending across the plurality of semiconductor fins, and
      a pair of opposing semiconductor fin end portions separated by the fin cut region;
   forming a dielectric tensile stressor layer on the monolithic structure, the dielectric tensile stressor layer including first portions extending into the fin cut regions and second portions extending over the source/drain regions and between the gate structures of the nFET and pFET regions;
   removing one of the first portions of the dielectric tensile stressor layer from the fin cut region within the pFET region, the first portion of the dielectric tensile stressor layer within the fin cut region of the nFET region and the second portions of the dielectric tensile stressor layer remaining essentially intact; and
   forming a metal compressive stressor layer within the fin cut region in the pFET region from which the one of the first portions of the dielectric tensile stressor layer was removed,
   wherein the first portion of the dielectric tensile stressor layer induces substantially uniaxial tensile stress in the direction of electrical current flow on the semiconductor fins in the nFET region and the metal compressive stressor layer induces substantially uniaxial compressive stress in the direction of electrical current flow on the semiconductor fins in the pFET region.

2. The method of claim 1, wherein forming the dielectric tensile stressor layer includes depositing a filling material comprising a silazane-chain material and oxidation curing of the silazane-chain material.

3. The method of claim 1, wherein each of the fin cut regions comprises a trench extending deeper than the bottom channel boundaries.

4. The method of claim 1, further including:
   removing the second portions of the dielectric tensile stressor layer to form trenches between the gate structures, and
   forming source/drain contacts within the trenches.

5. The method of claim 4, wherein the metal compressive stressor layer and the source/drain contacts are comprised of different metals.

6. The method claim 5, further including forming a dielectric cap on the metal compressive stressor layer.

7. The method of claim 5, wherein the metal compressive stressor layer consists essentially of titanium nitride or tungsten.

8. The method of claim 7, wherein the monolithic structure further includes gate cut regions extending through the gate structures and forming the dielectric tensile stressor layer on the monolithic structure further includes forming a third portion of the dielectric tensile stressor layer within the gate cut regions, wherein the third portion of the dielectric tensile stressor layer induces substantially uniaxial tensile stress in a direction perpendicular to the semiconductor fins in the nFET region and the pFET region.

9. The method of claim 8, further including:
   forming a patterned mask on the monolithic structure having a window exposing the dielectric tensile stressor layer within the fin cut region in the pFET region and portions of the gate cut regions in the pFET region, and
   wherein removing the one of the first portions of the dielectric tensile stressor layer from the fin cut region within the pFET region includes subjecting the monolithic structure to a selective etch to cause removal of an exposed region of the dielectric tensile stressor layer beneath the window.

10. The method of claim 5, further including forming a dielectric cap on the metal compressive stressor layer and electrically connecting the metal compressive stressor layer to a constant voltage source.

11. A method of fabricating a monolithic semiconductor structure including tensile and compressive stressors, comprising:
   obtaining a monolithic structure including an nFET region and a pFET region, each of the nFET and pFET regions comprising:
      a plurality of semiconductor fins, the semiconductor fins including channel regions, each of the channel regions having top channel boundary and a bottom channel boundary,
      a plurality of gate structures extending across the plurality of semiconductor fins,
      source/drain regions on opposing sides of each of the plurality of gate structures and operatively associated with the channel regions;
   forming a dielectric tensile stressor layer on the nFET and pFET regions of the monolithic structure, the dielectric tensile stressor layer extending over the source/drain regions, between the gate structures, and over portions of the semiconductor fins in the nFET and pFET regions;
   forming a patterned mask on the monolithic structure having one or more windows exposing a selected portion of the dielectric tensile stressor layer over the semiconductor fins in the pFET region;
   subjecting the monolithic structure to a selective etch to cause removal of the selected portion of the dielectric tensile stressor layer beneath the window; and
   forming a metal compressive stressor layer on the semiconductor fins in the pFET region from which the selected portion of the dielectric tensile stressor layer was removed,
   wherein the dielectric tensile stressor layer induces substantially uniaxial tensile stress in the direction of electrical current flow on the semiconductor fins in the nFET region and the metal compressive stressor layer induces substantially uniaxial compressive stress in the direction of electrical current flow on the semiconductor fins in the pFET region.

12. The method of claim 11, further including:

removing further portions of the dielectric tensile stressor layer to form trenches between the gate structures, and forming source/drain contacts within the trenches, wherein the metal compressive stressor layer and the source/drain contacts are comprised of different metals.

13. The method claim 12, further including forming a dielectric cap on the metal compressive stressor layer.

14. The method of claim 12, further including electrically connecting the metal compressive stressor layer to a constant voltage source.

* * * * *